United States Patent [19]

Wallgren et al.

[11] Patent Number: 4,855,572

[45] Date of Patent: Aug. 8, 1989

[54] HEATER FOR USE AS EITHER PRIMARY OR AUXILIARY HEAT SOURCE AND IMPROVED CIRCUITRY FOR CONTROLLING THE HEATER

[75] Inventors: Linus E. Wallgren, Rockville, Md.; Bobby L. Mason, Alexandria, Va.; William J. Siegel, Silver Spring, Md.; Ole V. Olesen, Annapolis, Md.; Louis A. Abbagnaro, Columbia, Md.

[73] Assignee: PACE Incorporated, Laurel, Md.

[21] Appl. No.: 6,422

[22] Filed: Jan. 23, 1987

[51] Int. Cl.$^4$ ............................................. H05B 3/68
[52] U.S. Cl. ................................... 219/456; 219/209; 219/430; 219/449
[58] Field of Search ............... 219/456, 455, 443, 449, 219/209, 200, 201, 438, 433, 429, 430, 432, 436, 450, 516, 217

[56] References Cited

U.S. PATENT DOCUMENTS

| | | | |
|---|---|---|---|
| 1,717,270 | 6/1929 | Shroyer | 219/460 |
| 2,392,635 | 1/1946 | Bletz | 219/516 |
| 3,543,006 | 11/1970 | Fjellstedt | 219/450 |
| 3,746,837 | 7/1973 | Frey | 219/456 |
| 3,924,284 | 12/1975 | Nelson | 219/217 |
| 4,268,741 | 5/1981 | O'Brien | 219/438 |

FOREIGN PATENT DOCUMENTS 451303  9/1948  Canada .................... 219/438

OTHER PUBLICATIONS

Popular Science, Nov. 1957, vol. 171, No. 5, p. 143.

Primary Examiner—Teresa J. Walberg
Attorney, Agent, or Firm—Gerald J. Ferguson, Jr.

[57] ABSTRACT

A heater unit and control circuitry therefor, the heater unit typically being employed as a preheater or primary heater for the installation and removal of electronic components from a PCB or the like and having various means for accommodating (a) an uneven surface or the presence of other components on the underside of the board or (b) an unlevel board. Moreover, a heater unit for sequentially providing preheat and primary heat from different zones of the heater is disclosed. A probe for use with the heater for sensing the temperature at various points on the board is also disclosed. The circuitry is characterized by ease of calibration of the heater temperature, the temperature transducing circuits, and the temperature setting circuits thereof. Moreover, circuitry is provided to insure the same voltage out of each input source in response to the input source measuring or setting a common temperature.

27 Claims, 6 Drawing Sheets

HEATER FOR USE AS EITHER PRIMARY OR AUXILIARY HEAT SOURCE AND IMPROVED CIRCUITRY FOR CONTROLLING THE HEATER

BACKGROUND OF THE INVENTION

This invention relates to a heater which may be used as a primary heat source or as an auxiliary heat source for use with a further heat source. In either use, the invention is suited, inter alia, for the installation and/or removal of modular electronic components with respect to a printed circuit board (PCB) or the like. Moreover, the invention relates to circuitry for controlling the heater and heat sensing elements that may be associated therewith.

Present day devices for removing or installing modular surface mounted devices (SMD's) from a substrate such as a printed circuit board include those which use heated, flowing air to melt the solder. In particular, these devices direct the flow of the heated air at the component terminals from a primary heated air source disposed above the component to simultaneously melt the solder at the terminals. Such a device, for example, is disclosed in U.S. Pat. No. 4,366,925 and co-pending application Ser. No. 649,065, filed Sept. 10, 1984, both the foregoing patent and application being incorporated herein by reference. Since in some applications, the components or substrates may be subjected to thermal shock due to the temperature difference between the solder melt temperature of the heated air and the ambient room temperature of the component, it is desirable to provide a preheater positioned beneath the printed circuit board and, in particular, the *component to be removed or installed, to preheat the board to a temperature below the solder melt temperature but well above room temperature. Such a preheater is generally disclosed in the above-mentioned co-pending application.

Other considerations relating to the desirability of preheating the printed circuit board and component are (a) many components and printed circuit boards are heat sinked and thus, in order to facilitate the task of the primary heater, a preheater can raise the temperature of the heat sinked component or board to a temperature substantially higher than the ambient temperature to thus avoid the necessity of overdriving the primary heater to overcome the heat draining property of the sink and (b) it is desirable the solder melt heat applied from the primary source be applied as quickly as possible for several reasons including lessening the danger of damaging adjacent components. Thus, by initially raising the temperature to the preheat temperature, the time the solder melt heat is applied can be lessened.

As will be described further below, not only is a preheater of the above type provided in accordance with the present invention, but also a heater which may be used as a primary heat source in place of the hot air source described above.

In addition to devices for installing and removing SMD's, there are those which are directed to the installation and removal of through-hole mounted devices— that is, the leads of which extend through holes in the PCB. Many devices of this type employ a molten solder bath. One such device is described in co-pending application Ser. No. 763,704 filed Aug. 8, 1985, this application being assigned to the assignee of the subject application and is hereby incorporated by reference herein. In accordance with another aspect of the invention, through-hole mounted devices (and, in certain applications, even SMD's) may be installed or removed from a printed circuit board or the like using a heater in accordance with the present invention which does not utilize molten solder or the like.

When employed as a preheater for a printed circuit board, the heating element should be brought into intimate contact with the underside of the board to insure good heat flow from the element to the board. However, the underside of the board typically includes at least terminals, pads, and connections and may also include circuit components assuming components are mounted on both sides of the board. Thus, the underside of the board will be uneven and intimate contact may be difficult to achieve. As will be described below, various measures are provided in the present invention to accommodate unevenness on the board underside.

In a heater of the type employed in the present invention, an electrical current is passed through a heating element, such heaters, in general, being well known. Circuits are also known which control the temperature of the element in response to a heat sensing element, which measures the temperature of the heating element or a heat transfer member in intimate contact with the heating element. In general, such systems compare the desired temperature of the heating element (which is usually externally set by an operator) with the temperature measured by the heat sensing element. The current through the heating element is then turned on and off in response to the measured temperature being greater or less than the desired temperature, respectively. In this manner, an attempt is made to maintain the heating element at an equilibrium temperature corresponding to the desired temperature as the heating element loses heat to its surroundings and gains heat from the electrical current source.

Such heater control circuits are subject to several shortcomings. In devices of the above type, the desired temperature is usually set by adjusting a potentiometer, the magnitude of the voltage output of which corresponds to the desired temperature. Moreover, the temperature of the heating element is measured by a transducer which converts the measured temperature to another voltage, the magnitude of which corresponds to the measured temperature. Due to inaccuracies in the circuits for providing the above voltages, the voltage output of the transducer may not in actuality correspond to the desired temperature of the heating element when an indication is given by the circuitry that the desired temperature has been reached. This difference between the actual temperature and the desired temperature of the heating element can, in many instances, be substantial and thus the heat delivered by the heating element to a work can deviate substantially from what is required to do the job. In such instances, a display of the measured voltage may be 280° F. while the potentiometer may be set to 250° F. Needless to say, the operator is at a loss as to which temperature value is correct.

In accordance with one feature of the invention, improved circuitry is provided which insures the temperature set by the operator will be substantially the same as that measured by the heat sensing element. Moreover, improved circuitry is provided for facilitating calibration of the circuits which set the desired temperature and which measure the actual temperature where the number of components and the amount of time needed to effect the multiple calibrations are minimized.

When the operator sets a desired temperature this is typically a desired temperature at some point or area on the work and not on the heating element itself. In many applications, the temperature differential between the heat element and the point or area on the work can be very substantial. Thus, this can be a further reason that the heat delivered to the work is not that required for the job.

Improved circuitry is also provided, in accordance with a further aspect of the present invention, where the heat delivered by the heating element is such that, when an operator sets a desired temperature for a point or area on the work, the actual temperature at that point or area will correspond to the desired temperature set by the operator.

Although the above discussion has been in terms of measuring temperature, other physical parameters such as pressure may also be advantageously measured or controlled with the circuitry of the present invention.

When measuring temperature, the foregoing procedures may include determining the thermal characteristics such as thermal conductivity, heat capacity, etc. of the work. Assuming the work is a standard PCB, for example, these thermal characteristics, once determined with circuitry of the type employed in the present invention, will be known for all boards of the above type. In accordance with a further aspect of the invention, these known thermal characteristics may then be utilized to automatically determine, under microprocessor control, for example, the amount of heat needed to raise a point or area of the work to a desired temperature. Moreover, the process, by which the heat is delivered to the work may vary—that is, it may comprise electrical current heating, molten solder, heated air, etc. Again under microprocessor control, for example, the parameters characterizing each of these processes may be varied to ensure the delivery of the proper amount of heat to a desired point or area of the work in response to the thermal characteristics of the work, the characteristics having been predetermined as described above.

Other objects of the invention include the provision of an improved heater, which may be used as a preheater of the type aforementioned, although it has many other uses other than preheating a printed circuit board, as will become apparent from the following description.

Another object of this invention, when the heater of this invention is used as a preheater for preheating a printed circuit board or the like, is that it includes a platen which is mounted so as to wobble and therefore come into alignment with the bottom surface of a printed circuit board when the platen is placed against the underside of the printed circuit board. The platen also is self-leveling and therefore conforms to the level of the printed circuit board against which it is placed.

Another object of the invention is to mount the platen on a shaft which, in turn, is mounted in a bearing with sufficient play between the shaft and the bearing that the platen may wobble, as described above. The shaft further permits locking the platen in a fixed position thereby preventing any further wobbling of the platen for use as a primary heating surface.

The mounting of the platen such that it may wobble permits the platen to contact the printed circuit board on the underside thereof at all points, whereby even heating may be applied to the board and all portions thereof, even though the printed circuit board may not be level. This feature insures that a component to be removed from the board will be evenly heated from the underside thereof, which facilitates a clean removal of a component from the board without damage to the leads of the component.

Another object of the invention is to provide various compliant means such as heat conductive layers or beads to effect heat transfer from a heated platen to an uneven surface of a work such as the underside of a PCB.

Another feature of the heater of this invention when used as a preheater is its use with printed circuit boards having components on the both sides thereof. Assuming a component to be removed or installed is disposed on the upper side of the board and the preheater is disposed at the underside of the board, compliant projections extending upwardly from the platen or a plate disposed on the platen may be employed which engage the underside of the board at locations where no components are disposed. In this manner a board of the above type may be selectively preheated to facilitate removal or installation of the component on the upper side of the board.

In accordance with a further aspect of the invention the platen or heating element may be divided into a plurality of zones which deliver different amounts of heat to the work, the work and platen being relatively movable with respect to one another whereby a first zone of the platen may preheat the work and a second zone may deliver primary heat such as that necessary to effect either solder melt or joint formation.

In accordance with a further feature of the invention, a temperature probe or the like may be employed to measure the temperature at the upper surface of the board or at another suitable location to provide an indication of the upper surface temperature. This measurement may also be employed in a control loop including the heater to automatically maintain the board temperature at a desired preheat temperature or other desired temperature.

These and other objects of the present invention will be understood by those acquainted with the design and construction of such systems upon reading the following detailed description in conjunction with the accompanying drawings.

BRIEF DESCRIPTION OF THE DRAWINGS

The invention will be further illustrated by reference to the accompanying drawings, in which.

DESCRIPTION OF THE PREFERRED EMBODIMENT

Figure 1:
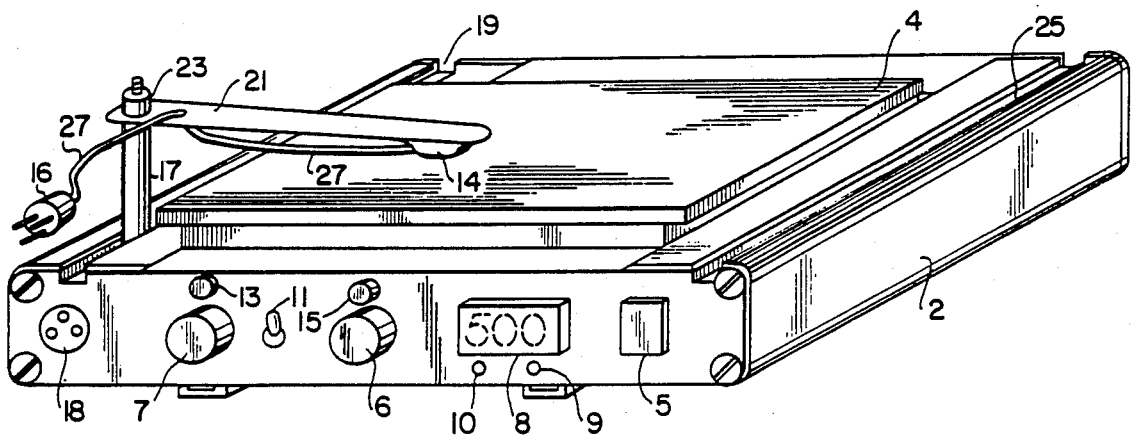
FIG. 1 is a perspective view of an illustrative heater in accordance with the present invention including an illustrative probe for use therewith.

Referring to FIG. 1, the heater of the invention includes a casing 2 which may be made of any suitable material such as aluminum, and having a platen or plate 4 mounted on the top thereof. An on-off power switch 5 actuates the heater.

The plate 4 may be heated, as described below, and the temperature thereof is controlled by a plate knob 6, the knob being provided with a calibrated face plate, not shown. A probe knob 7 sets a temperature which, when sensed by a probe 14, lights at least a probe alarm 9. A sound alarm may also be actuated. A toggle switch 11 switches a digital display 8 from either the probe circuitry or the plate circuitry, as will be described in detail with respect to FIG. 6. Push button switches 13 and 15, when actuated, respectively permit display of the settings of probe knob 7 and plate knob 6.

Figure 2:
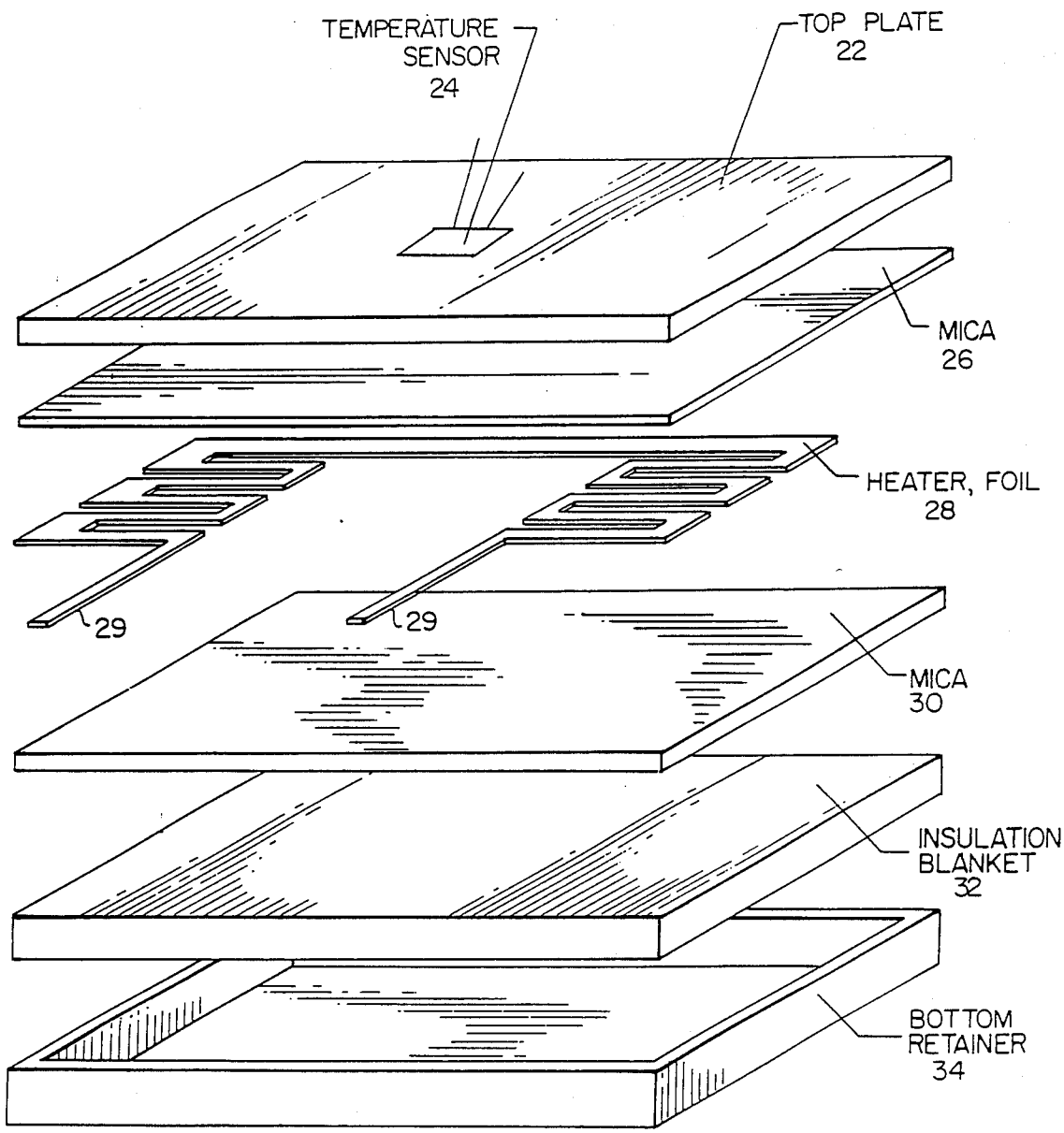
FIG. 2 is an exploded view showing an illustrative construction of the platen assembly of FIG. 1.

The temperature at the surface of the plate is sensed by a typically embedded temperature sensor, which is a thermistor preferably of the RTD type, or a thermocouple or other temperature sensing element 24, shown in FIG. 2, and the temperature is displayed on digital display 8 which may be of the LCD or LED type or other appropriate types. A light 10 on the front panel indicates when the display readout is in degrees Centigrade.

It is often desirable to measure and control the temperature of the top surface of a printed circuit board placed on the platen 4 and, for this purpose, an external probe 14 may be provided, which probe has a plug 16, which plugs into the external probe jack 18. As stated above, the probe readout is selected by the push button switch 13. This feature permits the heater to be controlled at a given platen temperature which produces a desirable temperature on the top surface of a printed circuit board. The probe 14 may comprise a thermistor preferably of the RTD type, thermocouple, or other heat sensing element and may be mounted with respect to a post 17, the post being slidable within either one of grooves 19 or 25 formed in the upper surface of the casing. Means (not shown) may also be employed to releasably attach the post at a given position along grooves 19 and 25. Frictional engagement between the post and grooves may also be employed for the foregoing purpose. Extending from the post may be a resilient support 21 for probe 14, the support 21 being rotatably mounted on the post and held in a given position by nut 23. Due to the positioning of post 17 along either of grooves 19 or 25 and the rotatable mounting of support 21, the probe may be easily positioned at a particular point on the upper surface of a PCB or the like, the PCB being positioned on or above plate 4 as long as the board is more narrow than plate 4 in the direction extending between grooves 19 and 25. If the board is wider than the plate, the probe with its wire 27 may be attached to a clothes-pin type clamp (not shown), which may be clamped to the side of the board to permit positioning of the probe where desired on the board.

FIG. 2 is a detailed view of the platen assembly. The platen assembly 4 may include a top plate 22 having temperature sensor 24 embedded just below the top surface of the plate 22. Below the top plate 22 is a sheet of mica 26 or like material which may have a thickness, for example, of 3-5 mils. Below the sheet of mica 26 is a heater foil 28 which may be made of stainless steel, nickel, copper, or any resistive material known for heater element design. The heater foil is very thin and may have a thickness, for example, of 0.002 inch. The foil has leads 29 for connection to a voltage source such as line voltage.

Below the heater foil 28 is another layer of mica 30 which may have a thickness, for example, of 25-30 mils. The lower layer of mica 30 is relatively thick compared to the layer of mica 26 in order to direct heat upwardly to the top plate 22. Below the lower layer of mica 30 is an insulation blanket 32 which also helps direct heat flow towards the top plate 22. The insulation blanket may be of any known insulating material such as a blanket made from spun ceramic fibers containing aluminum oxide and silicon dioxide. The thickness of the insulation blanket 32 is not critical and depends upon the heat requirements of the top plate 22. A thickness of 0.5 inch has been found to be satisfactory.

The assembly is completed by the bottom retainer 34, which is made of steel or other suitable material, and the elements 26, 30, and 32 are contained therein in sandwich fashion. The top plate 22 may be larger, as shown in FIG. 4.

The top plate 22 may be made of any suitable material which is a heat conductive, such as aluminum or steel and the thickness thereof is not critical, as long as it is sufficiently thick to provide both thermal flywheel capability and uniform temperature across the surface thereof.

The dimensions of the top plate 22 also are not critical and may be dependent upon the size of the printed circuit board or other object to be heated. The plate may, for example, have a width of 5.5 inches and a length of 5.5 inches.

Figure 3:
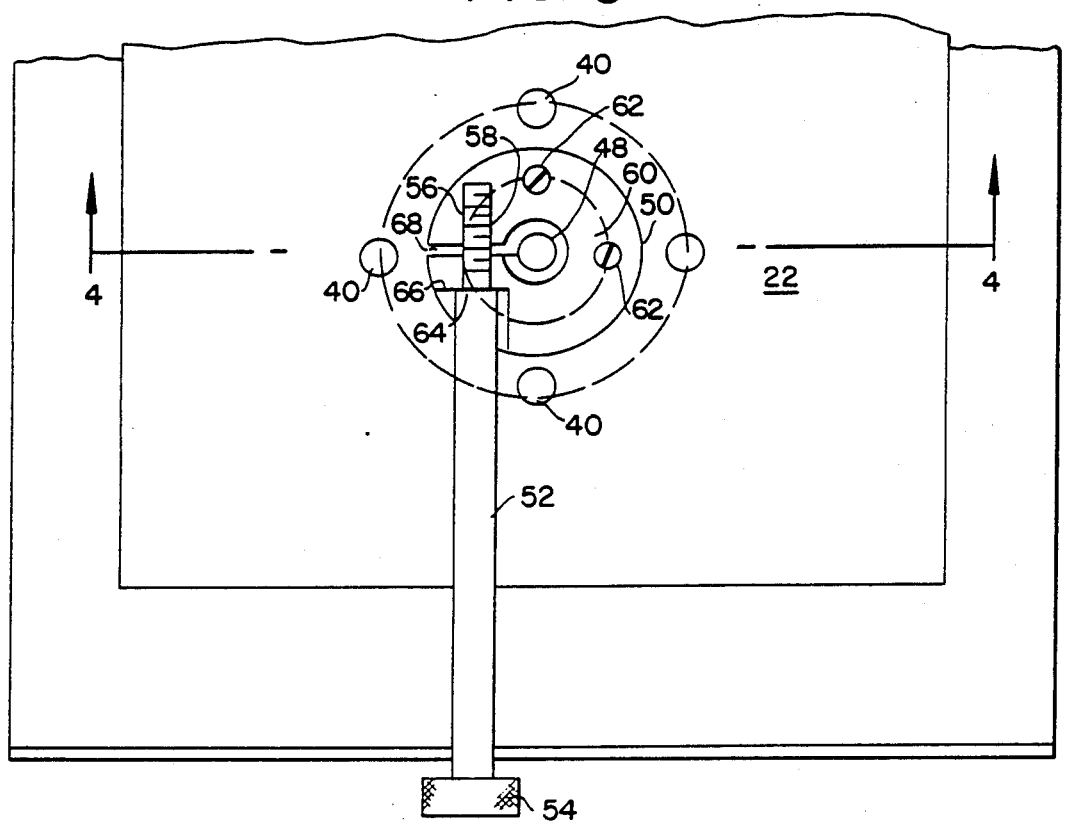
FIG. 3 is a top view of the heater with a portion of the casing and the controls not shown.
Figure 4:
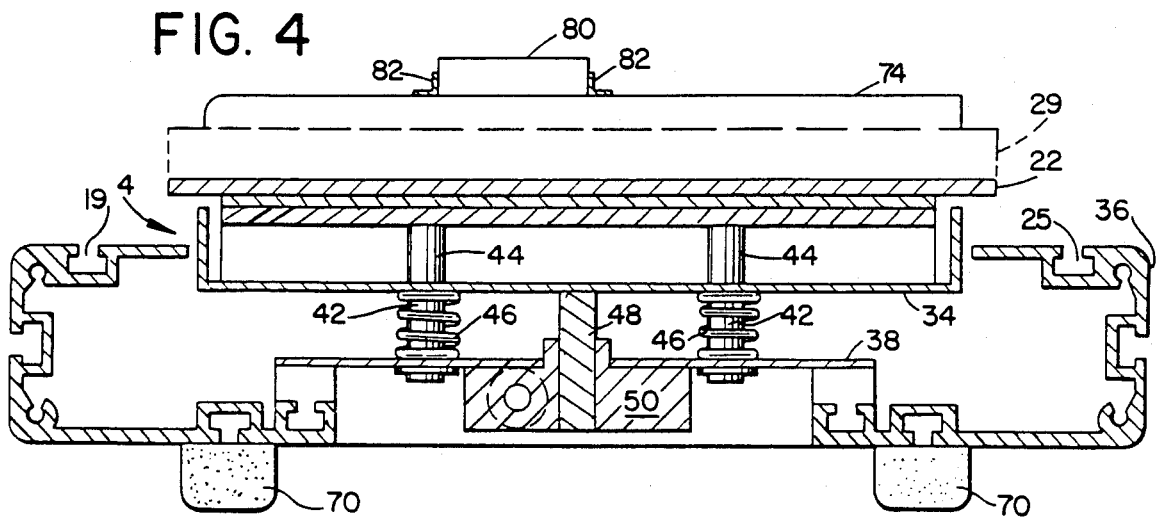
FIG. 4 is a view in section taken on line 4—4 of FIG. 3 which also shows an illustrative compliant, heat transfer medium for use with the invention.

Referring to FIGS. 3 and 4, in FIG. 4 the housing cover 2 is removed and the extruded housing 36 is shown. In the interior of the housing 36 is a supporting plate 38, which is secured to the housing 36 by means of screws, not shown. The supporting plate 38 has four apertures 40 therein, equidistantly spaced on a circle as shown in FIG. 3. A headed bolt 42 slid ably extends through each of the apertures 40 and is threaded into the platen assembly 4 as shown at 44. A compression spring 46 is mounted on each of the bolts 42 between the platen assembly 4 and the supporting plate 38 thereby biasing the platen assembly 4 away from the supporting plate 38.

The platen assembly 4 is mounted on a shaft 48, which shaft is mounted with a sufficient amount of play in a bearing block 50 that the platen assembly 4 may wobble when pressed on any portion of the surface 22 thereof.

Once the surface 22 of the platen assembly 4 has been placed against a printed circuit board to be heated, the platen assembly 4 may be locked in place by means of the rear-mounted locking screw 52 having a knurled head 54 and a threaded end 56. The threaded end 56 of the locking screw is received in a threaded bore 58 in a locking collar 60 formed in the bearing block 50.

As shown in FIG. 3, the bearing block 50 is secured to the supporting plate 38 by means of the screws 62. Thus, when the knurled knob 54 is rotated, a stepped portion 64 of screw 52 abutting against a cutaway portion 66 in the bearing block 50 acts by means of the threaded portion 56 to close the slot 68, thereby locking the locking collar 60 around the shaft 48 to prevent any wobbling of the shaft 48 in the bearing block 50.

The entire assembly is supported on the rubber feet 70 shown in FIG. 4.

The unit generally operates at a temperature in the range of about 200°–500° F., although any temperature range may be employed and there may be occasions where printed circuit boards must be heated which have components on both the top and bottom sides, for example, and it is not desired to heat the components on the bottom side of the board.

Figure 5:
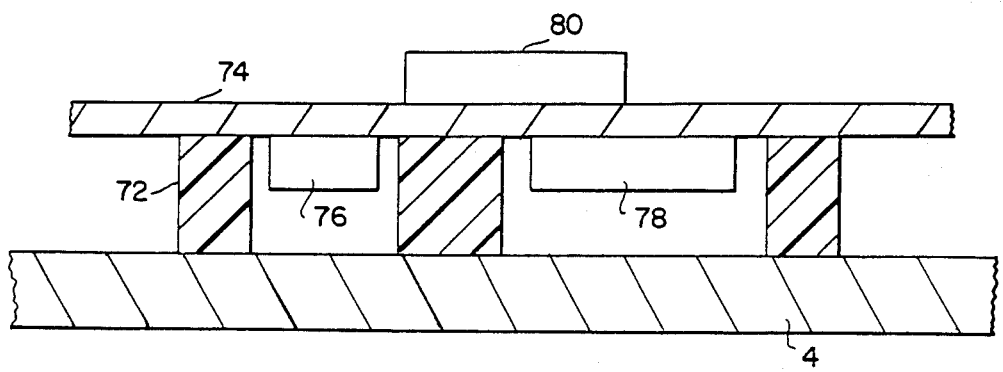
FIG. 5 is a schematic view showing a portion of the platen with a template mount thereon.

In this situation, a construction such as that illustrated in FIG. 5, can be employed. In this construction, the platen 4 has a template 72 comprising a plurality of projections mounted either fixedly or removably with respect to the platen. The template spaces platen 4 away from a printed circuit board 74, and components 76 and 78 on the bottom thereof and component 80 on the top thereof.

The cutout template 72 surrounds the components 76 and 78 and thus these components are not heated, whereas the other areas of the printed circuit board 74 are heated by conduction through the template 72. The template 72 may be either rigid, flexible or compliant and may be made of any material such as silicone rubber which will conduct heat to preselected areas of the bottom side of the circuit board 74, and either avoid components such as 76 and 78 on the bottom side thereof, and/or heat higher mass areas as desired. Moreover, the projections may comprise different materials such that different amounts of heat are conducted to different portions of the board.

Also, a platen 4 formed with custom cutouts to accommodate leads of printed circuit components may be employed so that when the platen 4 is placed adjacent the lower side of a printed circuit board 74, the components such as 76 and 78 will be received in cutouts in the surface of the platen 4, and thereby not be subjected to direct heat by contact with the platen surface.

In many instances, the lower surface of the circuit board 74 is irregular and a compliant layer, such as diagrammatically indicated at 29 in FIG. 4 where the layer 29 may be made of silicone rubber may be attached (either fixedly or removably) to the surface of the platen 4. A circuit board indicated at 74 may be positioned on layer 29 and clamped into position by clamping means (not shown) with respect to the platen assembly.

The heater units of FIGS. 1–5, or 7–9, may be employed in an off-line position. That is, preparatory to a board being processed by the heating device of the above-mentioned co-pending application Ser. No. 649,065, for example, it may be preheated to a below-solder-melt temperature by the units of FIGS. 1–5 or 7–9. At the same time, another board, which has been previously preheated by one of the above units, may be subjected to installation or removal of a component by a )primary heating unit. In this manner boards can be processed in assembly-line fashion with preheating occurring off-line and the component processing occurring on-line at the heating unit of Ser. No. 649,065.

Alternatively, both preheating and heating may occur at the unit of Ser. No. 649,065. Thus, when an X-Y table such as that disclosed in co-pending application Ser. No. 914,921 filed Oct. 3, 1986, which is assigned to the assignee of the present invention and which is incorporated herein by reference, is employed with the heating device of Ser. No. 649,065, the units of FIGS. 1–5 or 7 and 8 may be inserted under the table 76 of Ser. No. 914,921 to effect on-line preheating. If necessary, means (not shown) for clamping plate 4 of units 1–5 or 7 and 8 to a lower position against the bias of springs 46 may be employed to facilitate insertion of the above units under table 76 of Ser. No. 914,921. It will be appreciated heating units other than that of Ser. No. 649,065 may be employed to effect component removal or installation such as known resistance heating devices, current conducting devices or soldering or desoldering devices.

Figure 7:
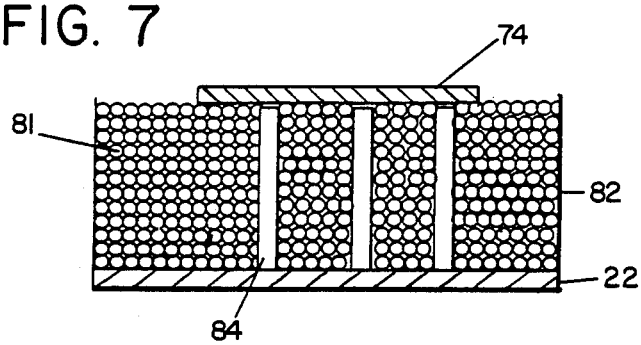
FIG. 7 is a schematic view of a further compliant heat transfer medium using heated beads in accordance with the invention.
Figure 8:
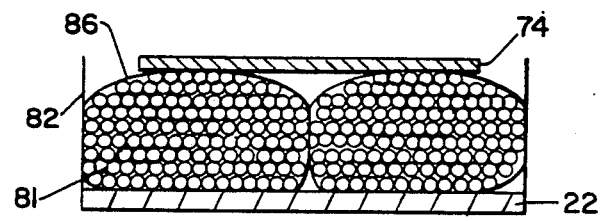
FIG. 8 is a schematic diagram of an illustrative modification of the heater of FIG. 7 wherein the beads are disposed within bags.

Other embodiments of the invention for effecting intimate, compliant contact between plate 4 and the uneven underside of board 74 are illustrated in FIGS. 7 and 8. In each of these embodiments, small beads 81 of glass, steel, or copper, or a like material are utilized as a heat transfer agent. These beads can vary in diameter from about 1/32 inch to ¼ inch.

In FIG. 7, the beads 81 are disposed within a container 82 and heat is conducted through the beads to the uneven underside of board 74. In FIG. 8, the beads are disposed in bags 86 made of, for example, glass fabric. Thus, the bags may extend above the upper edge of container 74 to facilitate the heating of larger objects. Moreover, bags 86 more effectively contain the beads. That is, the beads are loose in container 82 of FIG. 7 and thus spillage may occur. The bags 86 of FIG. 8 prevent this.

Figure 6A:
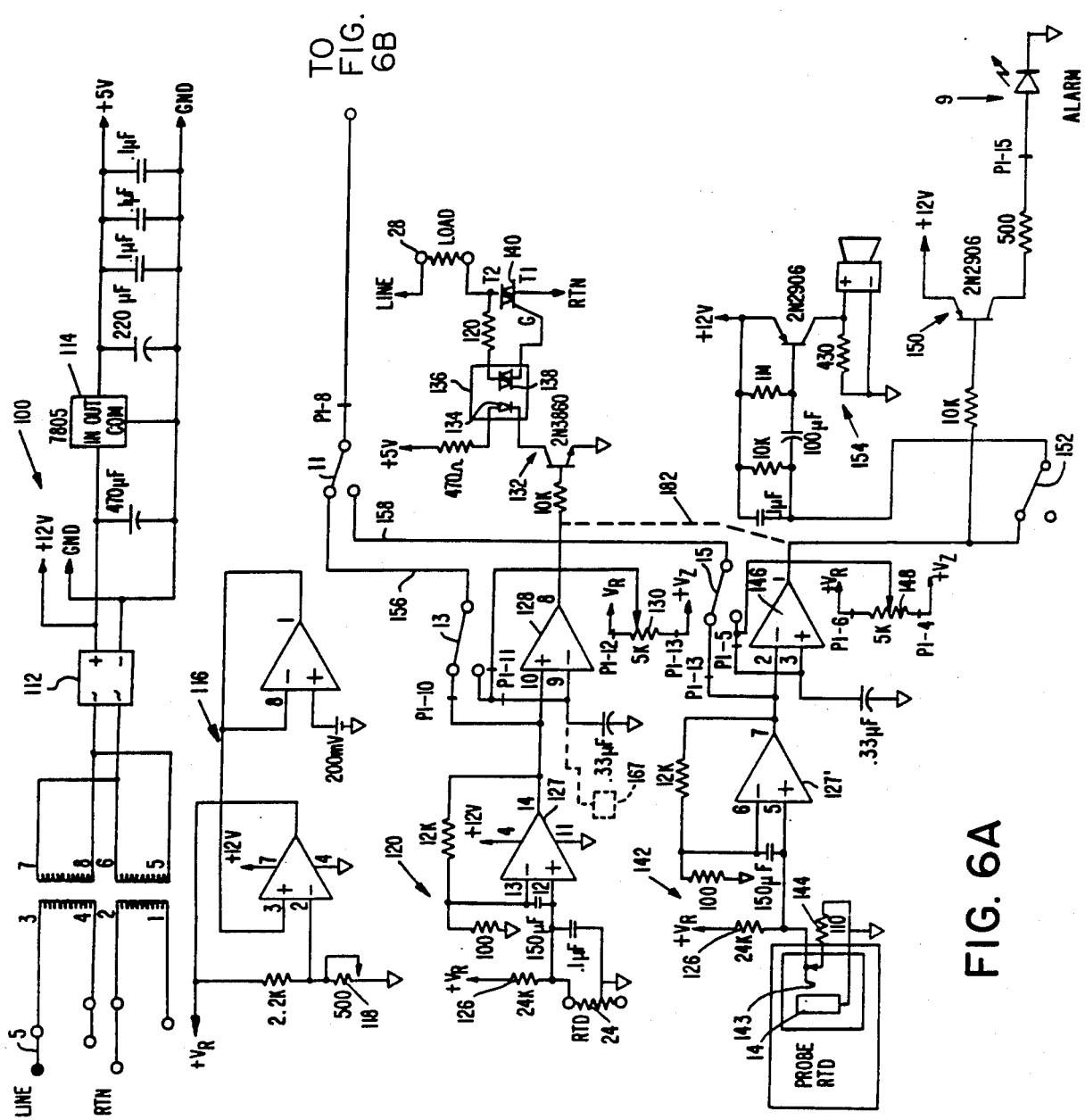
FIGS. 6A and 6B together are a schematic diagram of an illustrative temperature control circuitry for use with the invention.
Figure 6B:
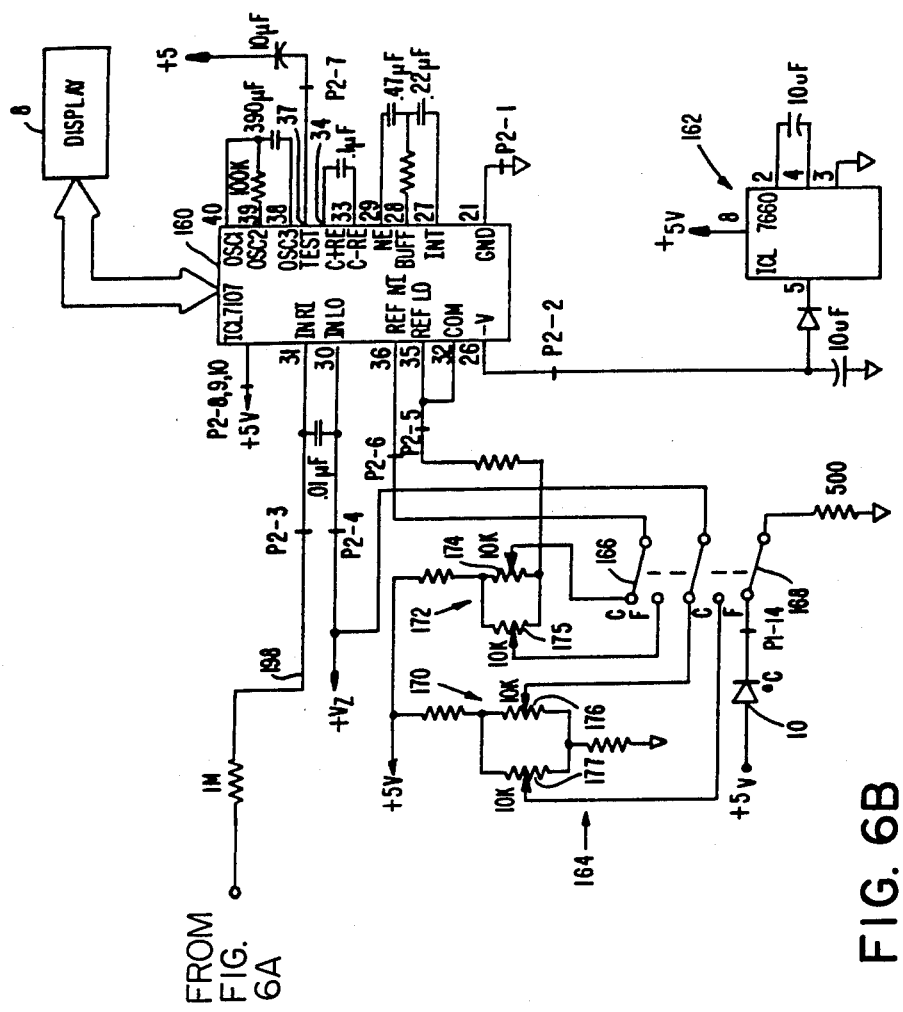

Reference should now be made to FIGS. 6A and 6B which together are a schematic diagram of illustrative control circuitry for the heating unit of FIG. 1. Values are given for components in FIGS. 6A and 6B, these values being illustrative where resistor values are in ohms and capacitor values are in microfarads unless otherwise note. A source for providing +12 volts and +5 volts reference voltages is indicated at 100, the source being responsive to the line voltage and employing full wave rectifier 112 and a five volt, voltage regulator 114. A regulated voltage source generally indicated at 116 and commercially available from National Semiconductor Co. as part number LM 10 generates a reference voltage $+V_R$, the magnitude of $V_R$ being 4.0 volts, for example, and adjustable by a potentiometer 118.

A plate transducing circuit generally indicated at 120 includes temperature sensor 24 of FIG. 2 which in the circuitry of FIGS. 6A and 6B is an RTD thermistor. Regulated reference voltage $V_R$ is connected to the thermistor via a precision resistor 126, the tolerance of which is typically about one percent. Thus the combination of regulated voltage source $V_R$ and precision resistor 126 act as a current source for thermistor 24, the resistance of which accurately varies between 110 and 200 ohms over a temperature range of 68° F. (20° C.) to 500° F. (260° C.). The output thermistor is applied to a precision operation amplifier 127 commercially available from National Semiconductor Co. under part number LM 324 where this integrated circuit also includes amplifier 127' and comparators 128 and 146, described below. The voltage applied from thermistor 24 is accurate within approximately one percent due to its accuracy and the accuracy of the current source feeding the thermistor. The output of plate transducer circuitry 116 (that is, the output of amplifier 127) is applied to the + input terminal of a comparator 128 while applied to the − input terminal thereof is the output of a plate potentiometer 130 which is controlled by knob 6 of FIG. 1. The output of the comparator is applied to a transistor 132, the collector of which is connected to the +5 volt reference source via an LED 134 of an opto-coupler 136 including a light sensitive, TRIAC 138. The output of the opto-coupler is applied to a TRIAC 140, the TRIAC being connected to the line voltage through heater foil 28 of FIG. 2.

A probe transducer circuit is generally indicated at 142 and includes probe 14 of FIG. 1. When the probe is connected to the circuit of FIGS. 6A and 6B via switch element 143 in socket 18, it varies over the same resistance range as thermistor 24. When probe 14 comprising a RD thermistor of the same type as thermistor 24 is disconnected from the circuit as shown in FIG. 6A and 6B, the current source comprising $V_R$ and resistor 126', where resistor 126' is the same type of resistor as resistor 126, feeds a 110 ohm resistor 144 which is connected to ground as will be further described below. The output of thermistor 14, when connected to the circuit, is applied to a precision amplifier 127', which is of the same type as amplifier 127. The output of probe transducer circuitry 142 (or the output of amplifier 127') is applied to the − input of a comparator 146, the output of a probe potentiometer 148 being applied to the + input terminal of the comparator. Potentiometer 148 is controlled by probe knob 7 of FIG. 1. The output of comparator 146 is applied to a transistor 150, the collector of the transistor being connected to probe alarm 9 which constitutes an LED, for example. A toggle switch 152, which may be provided on the back panel (not shown) of the unit of FIG. 1, may be employed to also connect the output of comparator 146 to an audible alarm circuit generally indicated at 154.

The output of plate transducer circuitry 120 or the output of plate potentiometer 130 may be applied to line 156 via plate push button switch 13 of FIG. 1. Moreover, the output of probe transducer circuitry 142 or the output of probe potentiometer 148 may be applied to line 158 via probe push button switch 15 of FIG. 1. One or the other of the signals on lines 156 and 158 may be applied to PIN 31 of digital display control circuit 160 via toggle switch 11 of FIG. 1. The control circuit 160 controls digital display 8 and is commercially available from Intersil, Inc., part number ICL 7187. This circuit requires a +5 volts reference voltage which is obtained from supply circuit 100 and a −5 volts reference voltage which is obtained from supply circuit 162, the supply circuit also being commercially available from Intersil, Inc. as part number 7660.

Generally indicated at 164 is a circuit for setting the temperature displayed by display 8 to either degrees F. of degrees C. when toggle switch 166 is in the position shown in FIG. 6, the reading displayed will be in degrees C., the switch being incorporated on the rear panel (not shown) of the unit of FIG. 1. As can be seen, the lower armature 168 of switch 166 connects the degree C. light 10 between the +5 volt reference voltage and ground where the degree C. light may be an LED, for example. Circuitry 164 includes a pair of dual potentiometer circuits 170 and 172 where circuits 170 and 172 are connected to the +5 reference voltage and where circuit 170 is employed to obtain a reference voltage, $+V_Z$, and circuit 172 is employed to obtain a REF HI voltage which is applied to PIN 36 of circuit 168 as will be described below. When the toggle switch 166 is in the position shown in FIG. 6, potentiometers 174 and 176 have their outputs respectively connected to PINs 36 and 30 of display control circuit 160. The input to PIN 36 sets the upper limit temperature reading (or span) of display 8, which in this case will be a °C. reading (typically 260° C.) while the input to PIN 30 sets the lower limit temperature reading of display 8 (typically 20° C., which generally corresponds to room temperature). By switching toggle switch 166 to its other position, the voltages applied to PIN's 36 and 30 from the potentiometer 175 and 177 then correspond to the upper and lower limits of the display temperature range in degrees F. (that is, 500° F. and 68° F. corresponding to the above °C. readings). Moreover, armature 168 is moved to disconnect the degree C. light 10 and thus turn it off.

In operation, a calibration step may first be performed to calibrate the temperature of plate 22 of the heater unit. That is, as discussed hereinbefore and as can be seen by referring to FIG. 4, for example, it may be desirable that a point or area on the upper surface of board 74 be raised to a temperature less than solder melt temperature. Solder melt temperature is approximately 365° F. Thus, it may be desirable to preheat terminals 82 of component 80 to about 265° F. In order to do this, one procedure which may be employed with the circuitry of FIGS. 6A and 6B is as follows. Toggle switch 11 is set as shown in FIGS. 6A and 6B so that the temperature of plate 22 will be displayed at display 8. Thus push button switch 13 should not be actuated—that is, it should be left in the position shown in FIGS. 6A and 6B. Next, the probe knob 7 of FIG. 1 should be adjusted until the output of probe potentiometer 148 equals the desired temperature of 265°. Next, assuming probe 14 is connected into socket 18, the probe is placed in contact with terminals 82 of component 80 (assuming the component is to be removed from board 74) or in contact with the board 74 immediately adjacent terminals 82 (assuming the component is to be installed on the board). Finally, the plate knob 6 is adjusted so that the plate potentiometer provides its maximum output voltage which corresponds to the maximum temperature plate 22 can be heated to.

With the foregoing settings effected, the temperature of plate 22 will commence to rise and thus heat will be conducted through layer 29 and board 74 to terminals 82 where probe 14 is positioned. Due to the presence of layer 29 and board 74, there may be a significant temperature difference between plate 22 and terminals 82. As the temperature at terminals 82 rises, the voltage applied to the minus terminal of comparator 146 will increase until it equals the desired terminal temperature of 265° F. At that time, the output of the comparator will switch to turn transistor 150 on and thus light probe alarm 9. If switch 152 is in the position shown in FIGS. 6A and 6B audible alarm 154 will also be actuated. At this time, the operator notes the reading at digital display 8, which has been set to read the temperature of plate 22, as described above. Assume the noted temperature is 350° F. The operator will then turn plate knob 6 so that the voltage output from plate potentiometer 130 corresponds to 350° F. The plate temperature will now be maintained at the 350° F. temperature. That is, immediately after the operator sets the plate potentiometer to a voltage corresponding to 350° F., the output voltage from thermistor 24 will be such that the voltage at the + terminal of the comparator 128 will exceed the potentiometer temperature applied to the − terminal thereof. Hence, the output of comparator 128 will be such as to turn off transistor 132 and thus cut off TRIAC 140 and the line current through heating element 28. Hence, the temperature of plate 22 will commence to drop until the voltage at the + terminal of the comparator 128 is less than that set at the − terminal thereof. The output of comparator 128 will again switch to turn on transistor 132 and thus the current through heating element 28 to thus bring the temperature of plate 22 back to the desired setting of 350° F. Of course, the temperature at terminals 82 will also be maintained at the desired preheat temperature of 265° F.

From the foregoing it can be seen a procedure for calibrating the temperature of plate 22 has been described above. That is, whenever a board of the same type as board 22 is employed, it will be known that the temperature of plate 22 must be set to 350° in order to establish a preheat temperature of 265° at the upper surface of the board. Hence, the calibration procedure described above need not be repeated once the thermal characteristics of board 74 are established by the calibration procedure. Subsequently, probe 14 may be employed to provide an alarm signal when the board upper surface reaches the desired temperature of 265°, for example.

In general, it should be noted that the thermal characteristics of different works such as PCB's can be established following the foregoing procedure and thus, it is within the scope of the present invention, to simply provide as an input data to circuitry of the type of FIGS. 6A and 6B the type of particular work or board to be heated or preheated and the circuitry will automatically heat plate 22 or an equivalent heating element or heat transfer element to a temperature of 350° F., for example. This automatic heating is effected either by the circuitry of FIGS. 6A and 6B or under microprocessor control. Even more generally, the thermal characteristics of different works such as board 74 may be determined both with respect to the vertical dimension thereof (the vertical direction in FIG. 4 through board 74) and the lateral direction thereof (that is, along the upper surface, for example, of board 74). These thermal characteristics then can be applied as input data to any type of heat source such as a heated air source, an electrical current source, a molten solder source, etc. to adjust the parameters thereof to effect a desired temperature at a desired point or area on the work where the foregoing may be effected under microprocessor control such microprocessor control being effected by microprocessor 167 generally indicated in FIGS. 6A and 6B as being connected to the − input of comparator 128 in place of potentiometer 130.

In the FIGS. 6A and 6B embodiment of the heater unit control circuitry, it is the temperature of plate 22 which is controlled to provide a desired temperature on the surface of the work—that is, for example on the upper surface of board 74 or at terminals 82 of component 80. In an alternative embodiment of the invention, the temperature at a point or area on the work such as the upper surface of board 74 can be controlled directly from a probe positioned at the upper surface, for example, of board 74. In such an embodiment, the output of comparator 146 would be connected to the input of transistor 132 as indicated by dotted line 182. In such an embodiment, plate transducer circuitry 120 together with plate potentiometer 130 and comparator 128 need not be employed. This would also apply to the alarms 9 and 154. The advantage the foregoing modification of FIGS. 6A and 6B is that the temperature at the work is directly monitored rather than monitoring a temperature at the heating unit. However, as described above, monitoring of the temperature at the heating unit can be readily be accommodated by the use of probe 14.

In another modification of FIGS. 6A and 6B the probe 14 and its associated circuitry, including comparator 146, potentiometer 148, alarm 9, and alarm 154 need not be employed. In such an instance, the temperature of heating element 28 would be monitored as described above with respect to FIGS. 6A and 6B. Moreover, in such an instance, it may be reasonably assumed that the desired temperature at the work approximately equals that of the plate 22 of the heater unit or other heat transfer element. Typically, in such instances, plate 22 would be in direct, intimate contact with the point or area on the work which is to be raised to a desired temperature.

In another instance, the probe 14 and its associated circuitry, as described above, need not be employed where the thermal characteristics of the work and/or any other intermediate member (such as layer 29 of FIG. 4) are known beforehand. That is, as described above, the thermal characteristics of the work or intermediate members can be determined beforehand and this information can be utilized to set the temperature of the heating element such as heating element 28 or the heat transfer member such as plate 22 such that the temperature at the desired point or area on the work can be accurately set to the desired temperature. Thus, assuming such thermal characteristics are known, probe 14 and its associated circuitry need not be employed.

A further aspect of the control circuitry of FIGS. 6A and 6B relates to circuitry thereof which insures that when the temperature is set at plate potentiometer 130 (for example, at 350° F., as assumed above), the temperature of the plate also substantially equals the temperature set at the potentiometer (that is, 350° F.). Of course, the plate temperature will not be 350° F. until it has risen to this temperature as determined by comparator 128. Moreover, the circuit of FIGS. 6A and 6B includes circuitry to insure that display 8 will display the same temperature whether displaying the temperature set at plate potentiometer 130 or the temperature of plate 22 itself. Such has not been the case in some prior art circuits where different readings have been provided for these two input sources. Such inconsistency of course confuses the operator as to which reading is correct.

In order to more fully describe the foregoing, the operation of display control circuit 160 will be further described. As stated above, the upper temperature reading or span of the display is set at pin 36 of circuit 160, the lower limit reading being set at pin 30. Regardless of whether the temperature of plate 22 or probe 14, or the setting of plate potentiometer 130 or probe potentiometer 148 is being displayed by display 8, the voltage corresponding to the measured thermistor temperature or potentiometer setting will occur on output line 198 connected to PIN 31. The particular voltage being applied to display 8 will depend upon the settings of switches 11, 13 and 15, as described above. Whenever, the voltage on line 198 corresponds to the lower limit temperature of thermistor 24 (for example, room temperature of 68° F.), the temperature displayed at display 8 will also be a temperature which approximates room temperature—that is, 68° F. Moreover, when the voltage on line 198 corresponds to the upper temperature limit of thermistor 24 (for example, 500° F.), the temperature displayed at display 8 will correspond to the upper limit temperature of the display which will also be 500° F. At temperatures between the upper and the lower temperatures, the voltage on line 198 is compared to the reference voltage at PIN 36 to provide a temperature reading which corresponds to the foregoing temperatures. In accordance with the present invention, all voltages on line 198, regardless of their source, substantially linearly vary between (a) the same lower limit voltage—namely, a voltage corresponding to room temperature, for example, this lower limit voltage being directly related to $V_Z$, and (b) the same upper limit voltage—that is, $+V_R$, which occurs at the upper limit of thermistors 14 and 24 and potentiometers 130 and 138, as will be described below. Since voltages $V_R$ and $V_Z$ are accurately regulated, regardless of which input source (thermistor 24, probe 14, potentiometer 130, or potentiometer 148) is connected to display circuit 160, display 8 will display the same temperature assuming the thermistors are measuring this temperature and the potentiometers are set at this temperature.

In order to insure that the potentiometers 130 and 148 will vary between $+V_R$ and room temperature voltage, for example, $+V_R$ and $+V_Z$ are applied to the respective upper and lower ends of these potentiometers as can be seen in FIGS. 6A and 6B. In order to insure that the voltage at the outputs of precision amplifiers 127 and 127' also linearly vary between $+V_R$ and the above room temperature voltage, the following calibration procedure is followed.

First, the magnitude of $V_R$ is chosen by adjusting potentiometer 118. This voltage may typically be 4.0 volts. This is ascertained by connecting a precision volt meter to any point on the FIGS. 6A and 6B circuit connected to the $+V_R$ reference voltage source. Once the magnitude of $V_R$ is established, a resistor of precisely known resistance is inserted in place of thermistor 24. In particular, the value of this resistor corresponds to the lower limit resistance value of RTD thermistor 24. For example, this value may be 110 ohms, which corresponds to 68° F. or 20° C., which, of course, approximates room temperature. With the circuit actuated and the 110 ohm resistor in place, the output voltage from precision amplifier 127 will correspond to the room temperature voltage. This voltage is applied through switches 13 and 11 to PIN 31 of display control circuit 160.

Next, $V_Z$ is set in the following manner for Fahrenheit and Centigrade temperature settings. Assuming the Centigrade setting is set first, potentiometer 176 is adjusted thereby varying the voltage at PIN 30 until display 8 displays a value of 20. Hence, whenever thermistor 24 has a value of 110 ohms, the voltage applied to PIN 31 will be such as to cause display 8 to display 20° C., assuming, of course, the Centigrade temperature reading has been selected.

The low temperature (or room temperature) setting of display 8 for Fahrenheit temperature readings is effected in a manner similar to that for setting the room temperature Centigrade setting. That is, with the precision 110 ohm resistor inserted in place of thermistor 24, the voltage at PIN 31 will be the same regardless of whether display 8 is set to display Fahrenheit or Centigrade temperature readings. However, in case of Fahrenheit readings, switch 166 will be toggled to the position not shown in FIGS. 6A and 6B. Potentiometer 177 is then adjusted to vary the voltage at PIN 30 until display 8 displays the numeral 68, which of course corresponds to Fahrenheit room temperature. Thus, $V_Z$ will vary depending on whether Fahrenheit or Centigrade temperature reading has been selected.

The calibration of the upper temperature reading of display 8 will now be described. First, a 200 ohm precision resistor is inserted in place of the 110 resistor used to calibrate the lower temperature limit reading of the display. This 200 ohm value corresponds to the upper resistance value of the RTD thermistor 24, which in turn corresponds to 500° F. or 260° C. With the 200 ohm resistor in place, and with the gain of precision amplifier 127 being 120, the output of amplifier 127 will be $+V_R$. That is, the voltage divider comprising precision resistor 126 (24K ohms) and the precision 200 ohm resistor attenuates $V_R$ by a factor of 120. Thus, by setting the gain of amplifier 127 to 120, $V_R$ occurs at the output of the amplifier. Of course, these values may change, the important consideration being that $V_R$ or a voltage linearly related thereto appear at the output of the amplifier at the upper limit of the thermistor or other temperature sensing element. This voltage will be applied to PIN 31 of display control circuit 160.

In order to set the upper limit of display 8 and assuming the Centigrade upper limit is to be set first, switch 166 is in its position shown in FIGS. 6A and 6B, potentiometer 174 is then adjusted to vary the voltage at PIN 36 until display 8 displays the value 260. Thus, whenever $V_R$ occurs at PIN 31 and the display is set to read Centigrade temperatures, 260° will be displayed.

In a similar manner, the upper limit of 500° is set in the display by switching switch 166 to its position not shown in FIGS. 6A and 6B and adjusting potentiometer 175 until the value 500 occurs at display 8. From the foregoing, it can be seen $V_R$, when it occurs at PIN 31, will set display 8 to either 260 or 500 depending on whether the Centigrade or Fahrenheit reading has been selected.

With the completion of the above steps, display 8 has been calibrated and the 200 ohm resistor may be replaced with the RTD thermistor 24. Such a thermistor is also used in probe 14 and thus the magnitude of the output of precision amplifier 127' will be the same as that which would occur at the output of precision amplifier 127 whenever the resistance value of thermistor 24 equals the resistance value of probe 14. Hence, by calibrating display 8 for thermistor 24, in the manner described above, calibration of display 8 for probe 14 is also effected. This is in contrast to prior art circuitry where each of the inputs to the display require separate adjustment to effect the separate calibration thereof.

Moreover, by calibrating display 8 for thermistor 24, in the manner described above, calibration of the display for plate potentiometer 130 and probe potentiometer 148 is also effected. In particular, when plate potentiometer 130 is adjusted to its highest value (corresponding to either 260° C. or 500° F.), the output from the potentiometer will be $V_R$. As described above for the calibration of thermistor 24, $V_R$, when applied to PIN 31, cause display 8 to be set to 260 or 500. Hence, by applying $V_R$ to not only plate temperature transducer circuitry 120 but also to probe transducer circuitry 142 and potentiometers 130 and 148, display 8 will always provide a reading of 260 or 500 whenever any of these input sources applies its maximum output voltage thereto since the maximum output voltage of each of these input sources is the same—namely, $V_R$ or a linear function thereof.

Moreover, with respect to the low temperature reading (for example room temperature reading) of display 8, the output voltage from each of the above input sources will be the same in magnitude whenever these outputs correspond to room temperature, for example. Thus, as described above with respect to the calibration of plate transducer circuit 120, the output thereof, when the value of thermistor 24 is 110 ohms corresponding to room temperature, will be such as to cause a reading of 20° C. or 68° F. at display 8. Display 8 will also display one of these values when probe transducer 142 is connected thereto (and measuring room temperature of 68° F. or 20° C.) since all components and reference voltages (in particular reference voltage $V_R$ are the same). Moreover, potentiometers 138 and 148 are so calibrated that when the voltage output thereof corresponds to room temperature, this voltage will be the same as the voltage which occurs at the output of precision amplifier 127 when a 110 ohm resistor is employed in place of the thermistor. Hence, the potentiometers 130 and 148 will also cause the display of 20 or 68 when the outputs thereof are set to correspond to room temperature.

Furthermore, with respect to temperatures between the upper and lower limits, thermistor 24 and the thermistor of probe 14 are extremely linear devices and thus the outputs of precision amplifiers 127 and 127' will be the same for all temperatures between the upper and lower limits. Hence, display 8 will read the same temperature for each of these input sources whenever they sense the same temperature.

Moreover, with respect to potentiometers 130 and 148, they are both connected at the respective ends thereof to highly regulated voltages $V_R$ and $V_Z$. Moreover, these potentiometers are also linear devices although they may vary somewhat. Any such variations will be compensated for due to the connection of the opposite ends thereof to the highly regulated voltages $V_R$ and $V_Z$. Thus, for all temperatures between the upper limit and lower limit room temperature, the voltages out of potentiometers 138 and 140 will be the same in magnitude and the same as either one of the outputs of precision amplifiers 127 and 127' whenever either one of the pots is set to the same temperature as the temperature being sensed by either one of the transducing circuits 120 and 142.

Accordingly, it can now be seen that by calibrating display 8 for one of the input sources such as plate transducer circuitry 120, the display is calibrated for the remaining sources due to the application of $V_R$ to other transducing input circuitry where the number of transducing input circuits may be two or more and due to the application of $V_R$ and $V_Z$ to potentiometer input sources and the number of potentiometer input sources may be two or more. Hence, the calibration procedure is significantly simplified. Moreover, the number of components needed to effect this precise calibration is significantly reduced. In prior art circuitry, each input source has required individual adjusting to effect calibration thereof with respect to an output such as display 8. Such individual calibration increases the number of components needed to effect the requisite calibration, the increase generally being a function of the number of input sources. Accordingly, it can be seen that the manufacturing cost of the circuitry of FIGS. 6A and 6B is lessened due to the reduced number of components needed for calibration. Moreover, the amount of time needed to effect calibration at the manufacturing facility is accordingly also significantly reduced, thus effecting a further saving in manufacturing cost.

Moreover, with respect to the user of the equipment, regardless of the input source, the display will provide the same reading whenever the output voltages of the input sources corresponds to the same value of a measured physical parameter such as temperature. In prior art devices, the potentiometer 130 may be set for 350° while the displayed temperature of plates 22 may be 370° after the plate has reached its equilibrium temperature. This is, of course, due to inaccuracies in the circuitry, such inaccuracies being avoided in the circuitry of the present invention. Furthermore, if the user wishes to check the accuracy of the heater unit control circuit, he can do so in the following manner. Assuming the temperature of plate 22 is read by display 8 as 370°, the user can measure the temperature of the plate with a separate device. In prior art circuitry, the separate measurement might be 350°. Again, this is caused by circuit inaccuracies which are avoided in the present invention.

Other features of the circuit of FIGS. 6A and 6B are as follows. The probe alarm 9 may also be employed as an over temperature alarm. That is, the probe may be positioned at a point on the work where the temperature should not exceed a certain value. When so positioned, and after probe potentiometer 148 has been set to the above value, actuation of alarm 9 will indicate the above temperature value has been exceeded.

Referring to resilient switching element 143 in jack 18, this element is moved out of contact with the resistor 144 and into contact with the non-grounded end of the thermistor of probe 14 in response to the probe being inserted in jack 18. Of course, in this state, probe 14 effects its temperature sensing function as described above. In response to the probe 18 being withdrawn from jack 18, element 143 is again moved into contact with 110 ohm resistor 144. Hence, since 110 ohms corresponds to the room temperature value, as discussed above, display 8 will display the room temperature value of 20 or 68 in response to the probe being removed from the jacks.

Figure 9:
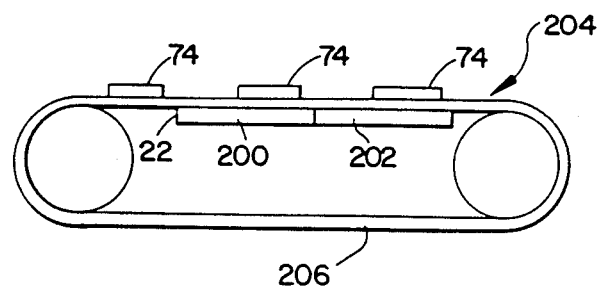
FIG. 9 is a schematic illustration of a further heater, in accordance with the invention, where two or more heat transfer zones are employed.

Reference should now be made to FIG. 9 which illustrates a further embodiment of the heater unit of the present invention where plate 22 is divided into zones 200 and 202. Typically zone 202 may comprise a material corresponding to that of plate 22, as described above, whereas plate 200 may comprise a different material such as thin stainless steel. Moreover, means such as endless belt 204 may be employed to effect relative movement between the work 74 and plate 22. Thus, zone 200 may be so heated to bring boards 74 to a preheat temperature of 250° to 300° F. while zone 202 may be made of a material which brings the board up to at least a solder melt temperature of at least 365° F. to effect solder melt and thus facilitate component removal or a temperature of 500° F. to thus effect the formation of a solder joint and thus facilitate component installation.

By making zones 200 and 202 of different materials and different thicknesses they will be raised to different temperatures assuming plate 22 is heated by common heater element 28 of FIGS. 2 and 6A and 6B. An alternative arrangement would be to connect zone 1 as the load for heating element 28 and employ the output of comparator 146 of FIGS. 6A and 6B to control the heat applied to zone 202. That is, the control circuit connected to the output of comparator 128 would be duplicated and connected to the output of comparator 146 to control the temperature of zone 202. Thus, separate heater units may be respectively employed for zones 200 and 202. In this instance, the zones 200 and 202 need not necessarily be made of different materials. In fact, a plate such as plate 22 may be employed where a temperature sensor corresponding to sensor 24 may be disposed in zone 200 and another temperature sensor corresponding to the thermistor of probe 14 may be disposed in zone 202.

From the foregoing it can be seen that the circuitry of FIGS. 6A and 6B may be to heat two different heating elements—that is, zones 200 and 202 of plate 22. In general, the two or more different heating elements may be employed with any two or more different heat sources, respectively. For example, one of the heat sources may be a soldering iron while the other may be a desoldering iron. Regardless of what the two sources are or how they differ, the advantages of the circuitry of FIG. 6 are nevertheless retained, as described above with respect to ease of calibration of the different heat sources for the single output such as display 8.

One embodiment for effecting relative movement of plate 22 with respect to the work such as a plurality of PCB's 74 utilizes endless belt conveyor 204 where the belt 206 may be made of a material corresponding to layer 29 of FIG. 4. Moreover, a lubricant may be employed either in belt 206 or between the belt and plate 22 to minimize friction between the belt and the plate. The plate is stationary and the boards 74 with components thereon move relatively with respect to the plate in the direction of the arrow, first encountering preheat zone 200 and then primary heating zone 202.

Although the heater of the present invention has been described specifically in connection with the preheating of printed circuit boards, obviously, it is capable of many other uses, as will be apparent to those skilled in the art.

It is to be understood that the above detailed description of the various embodiments of the invention is provided by way of example only. Various details of design and construction may be modified without departing from the true spirit and scope of the invention as set forth in the appended claims.

What is claimed is:

1. A heating system comprising base means, a platen mounted on said base means, heating means for heating said platen, means for fixedly holding said heating means in place, and a heat conducting, compliant member disposed on said platen and supporting a work to be heated; where said work is a substrate having at least one electronic component disposed thereon; and including a further primary heater, said component being mounted on a first side of said substrate and an uneven surface of the substrate being disposed on a side of the substrate opposite said first side, and where said means for heating the platen includes means for raising the temperature at said first surface to a primary temperature greater than a preheat temperature to thus effect said installation or removal of said component.

2. A heating system as in claim 1 including said work having an uneven surface, said uneven surface intimately contacting said compliant member due to flexibility of the compliant member to thus facilitate flow of heat to all portions of the uneven surface of the work.

3. A heating system as in claim 1 where said compliant member is made of silicone rubber.

4. The heater as in claims 2 or 3 where said compliant member includes a resilient layer disposed on said platen.

5. A heating system as in claims 1 or 2 where said compliant member includes at least one flexible bag for holding a plurality of beads, said bag being disposed on said platen.

6. A heating system as in claim 5 where said beads are made of materials selected from the group consisting of glass, steel, and copper.

7. A heating system comprising base means, a platen mounted on said base means, means for heating said platen means, means for fixedly holding said heating means in place, and a heat conducting, compliant member disposed on said platen; where said compliant member includes a container disposed on said platen and a plurality of beads disposed in said container.

8. A heater as in claim 7 where said beads are made of materials selected from the group consisting of glass, steel, and copper.

9. A heating system comprising base means, a platen mounted on said base means, means for heating said platen, and heat conducting template means, disposed on said platen, for conducting heat from said means for heating to preselected areas of said platen, where the template means includes a plurality of projecting members disposed on said platen.

10. A heating system as in claim 9 including a substrate having a plurality of electronic components disposed thereon, said substrate having first and second oppositely facing sides where a first one of said components is disposed at said first side and a second one is disposed at the second side and where said projecting members contact said second side without contacting said second component to facilitate the installation or removal of said first component.

11. A heating system as in claim 10 including a primary heater and where said means for heating the platen includes means for raising the temperature at said first side of the substrate to a preheat temperature and said primary heater includes means for raising the temperature at said first side to a primary temperature greater than the preheat temperature to thus effect said installation or removal of said first component.

12. A heating system as in claim 9 where said projections are made of silicone rubber.

13. A heating system as in claim 9 where at least one of said projections conducts an amount of heat different form the amount conducted by others of said projections.

14. A heating system comprising base means, a platen mounted on said base means in a manner such that said platen may wobble with respect to said base means, resilient means biasing said platen away from said base means, and means for heating said platen, including locking means for locking said platen in a stationary position with respect to said base means.

15. A heater according to claim 14 in which said resilient means are compression springs.

16. A heater according to claim 14 in which said resilient means are compression springs equidistantly spaced around a shaft supporting said platen means.

17. A heating system as in claim 14 including a substrate having at least one flat surface disposed on said platen, an intimate contact being established between the platen and a flat surface of a work to be heated due to the wobble in the mounting of said platen.

18. A heating system as in claim 17 where said work is a substrate having oppositely facing first and second sides where said flat surface is one of said sides.

19. A heating system as in claim 18 including a further primary heater, and where said substrate includes at least one component disposed thereon to be installed or removed, said component being mounted on said first side of said substrate, and where said means for heating the platen includes means for raising the temperature at said first side to a preheat temperature and said primary heater includes means for raising the temperature at said first side to a primary temperature greater than the preheat temperature to thus effect said installation or removal of said component.

20. A heating system comprising base means, a platen mounted on said base means in a manner such that said platen may wobble with respect to said base means, resilient means biasing said platen away from said base means, and means for heating said platen, in which said platen is mounted on said base means by a shaft in a bearing block with sufficient play between the two that the platen may wobble.

21. A heating system comprising base means, a platen mounted on said base means, said platen being divided into at least two zones, and heating means for heating first and second zones of said at least two zones to different temperatures, and where said zones are respectively made of different material and said heating means is connected to both of said zones.

22. A heating system as in claim 21 including a work and where said first zone includes means for raising the temperature of the work to a preheat temperature and said second zone includes means for raising the temperature of said work to a primary temperature greater than the preheat temperature.

23. A heater system as in claim 22 including means for relatively moving said work and said platen such that the work is raised to the preheat temperature prior to its being raised to the primary temperature.

24. A heater system as in claim 22 or 23 where said work comprises a substrate having first and second oppositely facing sides with at least one electronic component disposed on said first side to be installed or removed from the substrate and said platen disposed at said second side.

25. A heating system as in claims 22 or 23 where said zones are respectively made of different material and said heating means is connected to both of said zones.

26. A heater according to claims 1, 9, 14 or 21 including measuring means for measuring the temperature of an object disposed with respect to the platen including a probe.

27. A heater according to claims 1, 9, 14 or 21 in which said platen means comprises a top plate, a layer of mica, a foil heater, a layer of mica, and insulation blanket, and a bottom retainer.

* * * * *